(12) United States Patent  (10) Patent No.: US 9,054,232 B2
Chung  (45) Date of Patent: Jun. 9, 2015

(54) INTEGRATION OF GALLIUM NITRIDE LEDS WITH ALUMINUM NITRIDE/GALLIUM NITRIDE DEVICES ON SILICON SUBSTRATES FOR AC LEDS

(71) Applicant: Koninklijke Philips N.V., Eindhoven (NL)

(72) Inventor: Theodore Chung, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/378,113

(22) PCT Filed: Feb. 28, 2013

(86) PCT No.: PCT/IB2013/051613
§ 371 (c)(1),
(2) Date: Aug. 12, 2014

(87) PCT Pub. No.: WO2013/028410
PCT Pub. Date: Sep. 6, 2013

(65) Prior Publication Data
US 2015/0014628 A1  Jan. 15, 2015

Related U.S. Application Data

(60) Provisional application No. 61/603,985, filed on Feb. 28, 2012.

(51) Int. Cl.
*H01L 25/16* (2006.01)
*H01L 27/15* (2006.01)
(Continued)

(52) U.S. Cl.
CPC .............. *H01L 33/007* (2013.01); *H01L 33/06* (2013.01); *H01L 33/0025* (2013.01); *H01L 33/0033* (2013.01); *H01L 25/0756* (2013.01); *H01L25/074* (2013.01); *H01L 25/0657* (2013.01); *H01L 27/15* (2013.01)

(58) Field of Classification Search
CPC ............ H01L 25/0756; H01L 25/0657; H01L 25/074
USPC .................. 438/47; 257/13, 93, 96, 195, 257, 257/E27.12, E33.055
See application file for complete search history.

(56) References Cited

U.S. PATENT DOCUMENTS 5,361,273 A * 11/1994 Kosaka ........................ 372/50.23
6,593,597 B2 * 7/2003 Sheu ................................ 257/94
(Continued)

FOREIGN PATENT DOCUMENTS

EP  1858088 A1  11/2007
JP  2000036639 A  2/2000
(Continued)

*Primary Examiner* — Marvin Payen
*Assistant Examiner* — Jeremy Joy

(57) ABSTRACT

A method for fabricating an epitaxial structure includes providing a substrate (102, 202, 302, 402) and a heterojunction stack on a first side the substrate, and forming a GaN light emitting diode stack (134) on a second side of the substrate. The heterojunction stack includes an undoped gallium nitride (GaN) layer and a doped aluminum gallium nitride (AlGaN) layer on the undoped GaN layer. The GaN light emitting diode stack (134) includes an n-type GaN layer (136) over the substrate, a GaN/indium gallium nitride (InGaN) multiple quantum well (MQW) structure (138) over the n-type GaN layer, a p-type AlGaN layer (140) over the n-type GaN/InGaN MQW structure, and a p-type GaN layer (142) over the p-type AlGaN layer.

15 Claims, 7 Drawing Sheets

(51) Int. Cl.
*H01L 33/00* (2010.01)
*H01L 33/06* (2010.01)
*H01L 25/075* (2006.01)
*H01L 25/07* (2006.01)
*H01L 25/065* (2006.01)

(56) References Cited

U.S. PATENT DOCUMENTS

2002/0179914 A1* 12/2002 Sheu .............................. 257/90
2005/0167680 A1* 8/2005 Shei et al. ...................... 257/79
2007/0238208 A1* 10/2007 Nishida et al. ................. 438/29
2009/0261346 A1 10/2009 Chen et al.
2010/0019279 A1* 1/2010 Chen et al. .................... 257/194
2010/0308347 A1 12/2010 Yeh et al.

FOREIGN PATENT DOCUMENTS

| JP | 2002305327 A | 10/2002 |
| JP | 2003086784 A | 3/2003 |
| WO | 2011079645 A1 | 7/2011 |
| WO | WO 2011079645 A1 * | 7/2011 |

* cited by examiner

INTEGRATION OF GALLIUM NITRIDE LEDS WITH ALUMINUM NITRIDE/GALLIUM NITRIDE DEVICES ON SILICON SUBSTRATES FOR AC LEDS

CROSS-REFERENCE TO PRIOR APPLICATIONS

This application is the U.S. National Phase application under 35 U.S.C. §371 of International Application No. PCT/IB2013/051613, filed on Feb. 28, 2013, which claims the benefit of U.S. Patent Application No. 61/603,985, filed on Feb. 28, 2012. These applications are hereby incorporated by reference herein.

FIELD OF THE INVENTION

The present disclosure relates to semiconductor light emitting diodes, and more particular to gallium nitride light emitting diodes with aluminum gallium nitride/gallium nitride devices on a substrate.

BACKGROUND

A light emitting diode (LED) is a direct current (DC) device that needs a constant voltage supply. However, a LED-based light fixture runs from a mains supply of alternating voltage (AC). As a result, the LED-based light fixture includes a LED driver that is able to handle large AC and convert it to DC voltage. The LED driver is usually made of silicon devices such as laterally diffused metal oxide semiconductors (LDMOS) or power metal-oxide-semiconductor field-effect transistors (MOSFETs).

SUMMARY

In one or more embodiments of the present disclosure, a method for fabricating an epitaxial structure includes providing a substrate and a heterojunction stack on a first side of the substrate, and forming a GaN light emitting diode stack on a second side of the substrate. The heterojunction stack includes an undoped gallium nitride (GaN) layer over the first side of the substrate and a doped aluminum gallium nitride (AlGaN) layer on the undoped GaN layer. The GaN light emitting diode stack includes an n-type GaN layer over the second side of the substrate, a GaN/indium gallium nitride (InGaN) multiple quantum well (MQW) structure over the n-type GaN layer, a p-type AlGaN layer over the n-type GaN/InGaN MQW structure, and a p-type GaN layer over the p-type AlGaN layer.

BRIEF DESCRIPTION OF THE DRAWINGS

In the drawings.

Use of the same reference numbers in different figures indicates similar or identical elements.

DETAILED DESCRIPTION

As gallium nitride (GaN) has a higher band gap than silicon (Si), GaN transistors have a much higher breakdown voltage than Si transistors so GaN transistors can handle much higher voltage and current density. This allows smaller GaN transistors to handle the same voltage as larger Si-based power transistors. With the advent of GaN-on-Si technology, GaN transistors grown on 150 mm (6-inch) silicon substrates are price-competitive with silicon-based power devices and offer better performance. By integrating GaN light emitting diodes (LEDs) with GaN transistors on silicon substrates, the combined architecture will be more economical and have higher AC-DC conversion efficiency than the conventional approach that pairs GaN LEDs with a discrete Si-based electric driver.

In accordance with embodiments of the present disclosure, an epitaxial structure is made by forming GaN LEDs on one side of a substrate and forming aluminum gallium nitride (AlGaN)/GaN devices (or vice versa) on the other side of the substrate. The AlGaN/GaN devices may be heterojunction field-effect transistors (HFETs) and Schottky diodes used for AC-DC conversion or DC-DC down conversion (high-voltage to low-voltage conversion). Several LEDs and the AlGaN/GaN devices may be connected in series or in parallel depending on the conversion scheme.

Note the use of "over" includes forming one layer or a stack of layers directly on another layer or stack of layers. Depending on if a structure is located on a top or backside of a substrate, "over" may indicate one layer or a stack of layers above or below another layer or stack of layers, respectively. The term stack or stack of layers may be used interchangeably.

Figure 1:
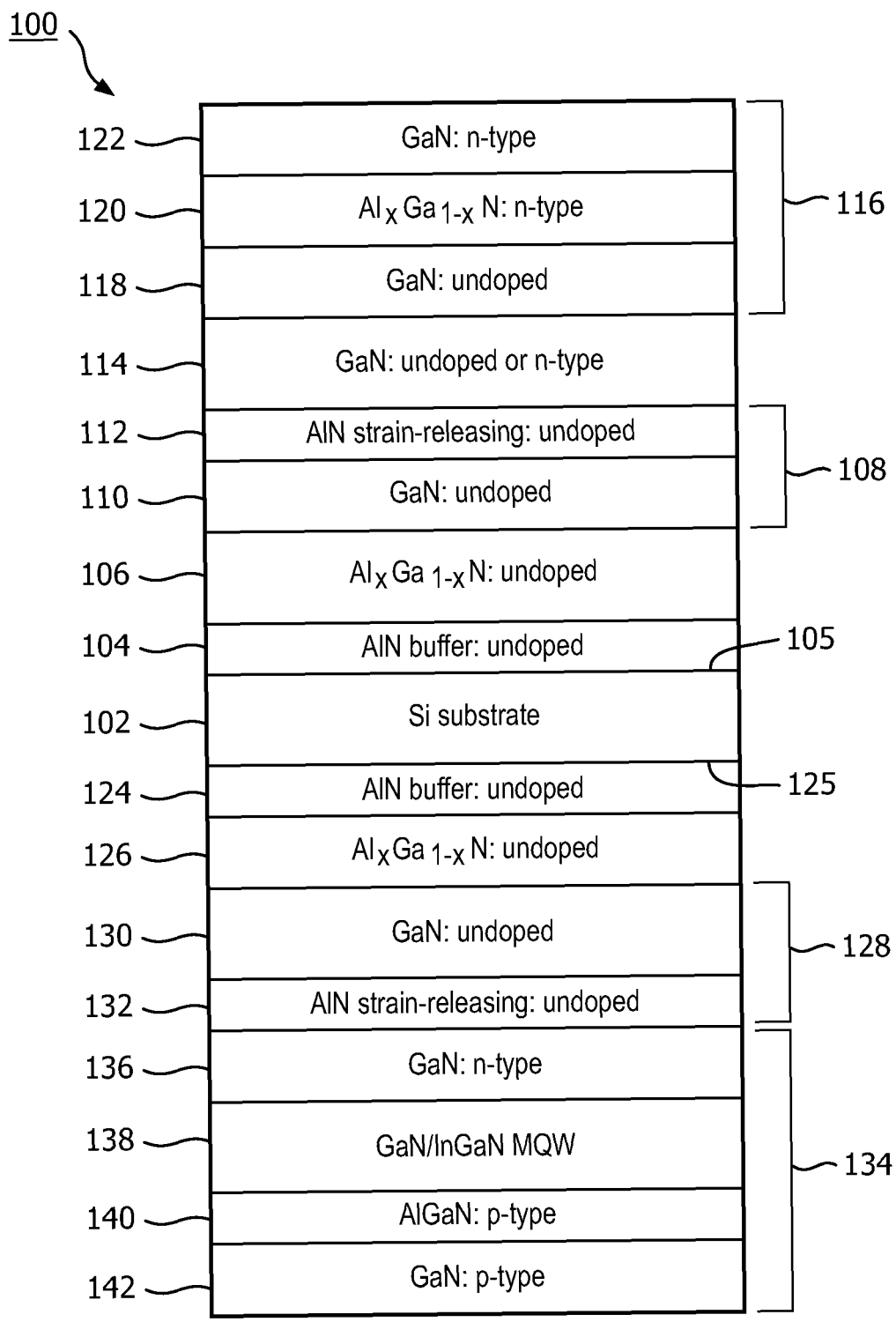
FIG. 1 is a cross-sectional view of an epitaxial structure for integrating gallium nitride (GaN) light emitting diodes (LEDs) with aluminum gallium nitride (AlGaN)/GaN devices on a silicon substrate.

FIG. 1 is a cross-sectional view of an epitaxial structure 100 for integrating GaN LEDs with AlGaN/GaN devices on a silicon (Si) substrate 102 in one or more embodiments of the present disclosure. As GaN is not well suited for direct epitaxial growth on Si substrates due to the fact that Ga and Si form an eutectic material that destroys the Si substrate, an undoped aluminum nitride (AlN) buffer layer 104 is first formed over a first side 105 of silicon substrate 102 (e.g., a topside as shown) to serve as a barrier between GaN and silicon. A thin AlN buffer layer 104 (e.g., 100 angstroms to 2 microns) is used to reduce defect density. An undoped $Al_xGa_{1-x}N$ layer 106 may be formed over undoped AlN buffer layer 104 to provide additional separation between Si and GaN.

A strain engineered stack 108 may be formed over $Al_xGa_{1-x}N$ layer 106. Strain engineered stack 108 accommodates the strain due to a thermal expansion difference between Si and GaN in structure 100. Strain engineered stack 108 includes an undoped or doped GaN layer 110 and an undoped or doped AlN strain-releasing layer 112 over GaN layer 110. GaN layer 110 of stack 108 is formed directly over $Al_xGa_{1-x}N$ layer 106. A second strain engineered stack 108A (not shown) may be formed over first engineered stack 108.

An undoped GaN layer 114 is formed over AlN strain-releasing layer 112 of strain engineered stack 108 to separate strain engineered stack 108 from an AlGaN/GaN heterojunction stack 116. Alternatively GaN layer 114 may be doped with n-type dopant such as iron (Fe) to increase its resistance. GaN layer 114 is a non-conducting layer which prevents lateral leakage current from any HFET formed in an AlGaN/GaN heterojunction stack 116 (described later) above GaN layer 114 when the HFET is turned off. Isolation trenches may be etched down to GaN layer 114 to electrically insulate devices formed above GaN layer 114.

AlGaN/GaN heterojunction stack 116 is formed over GaN layer 114. AlGaN/GaN heterojunction stack 116 includes an undoped GaN layer 118, a heavily doped, n-type $Al_xGa_{1-x}N$ layer 120 on undoped GaN layer 118, and a passivation layer 122 (e.g., an n-type GaN) over n-type $Al_xGa_{1-x}N$ layer 120. Undoped GaN layer 118 of heterojunction stack 116 is directly over GaN layer 114. AlGaN/GaN heterojunction stack 116 may be further processed to form devices including HFETs and Schottky diodes. Additional circuit elements may be integrated with, or built in layers over, AlGaN/GaN heterojunction stack 116. For example, a resistor may be made utilizing a semiconductor layer of AlGaN/GaN heterojunction stack 116 (e.g., GaN layer 118) by forming two metal contacts at a certain distance between them. Also, a capacitor may be made of a dielectric layer (silicon dioxide or silicon nitride) deposited above AlGaN/GaN heterojunction stack 116 and sandwiched between two metal layers, and an inductor may be made by forming a long winding metal pattern atop a semiconductor layer of AlGaN/GaN heterojunction stack 116 (e.g., GaN layer 118).

An undoped AlN buffer layer 124 is formed over a second side 125 of silicon substrate 102 to serve as a barrier layer between GaN and silicon. An undoped $Al_xGa_{1-x}N$ layer 126 is formed over undoped AlN buffer layer 124 to provide stress relief due to difference in thermal expansion and lattice constants between GaN and Si.

A strain engineered stack 128 may be formed over undoped $Al_xGa_{1-x}N$ layer 126. Strain engineered stack 128 includes an undoped GaN layer 130 and an undoped AlN strain-releasing layer 132 over undoped GaN layer 130. Undoped GaN layer 130 of stack 128 is directly over $Al_xGa_{1-x}N$ layer 126. The structure of strain engineered stack 128 may be repeated over another engineered stack 128.

A GaN LED stack 134 is formed over undoped AlN strain-releasing layer 132 of strain engineering stack 128. GaN LED stack 134 includes an n-type GaN layer 136, $GaN/In_yGa_{1-y}N$ multiple quantum well (MQW) layers 138 over n-type GaN layer 136, a p-type $Al_xGa_{1-x}N$ layer 140 over $GaN/In_yGa_{1-y}N$ MQW layers 138, and a p-type GaN layer 142 over p-type $Al_xGa_{1-x}N$ layer 140. Note that $Al_xGa_{1-x}N$ and $In_yGa_{1-y}N$ in different layers may be of different compositions and may be generally indicated as AlGaN and InGaN, respectively. N-type GaN layer 136 of stack 134 is directly over undoped AlN strain-releasing layer 132. GaN LED stack 134 may be further processed to exposed areas of n-type GaN layer 136 and p-type GaN layer 142 for forming n- and p-contacts. Additional circuit elements may be integrated with, or built in layers over, GaN LED stack 134.

Note that GaN LED stack 134 is not formed over a non-conducting GaN layer like heterojunction stack 116 because LEDs are vertical devices so lateral leakage current is not of great concern.

Figure 2:
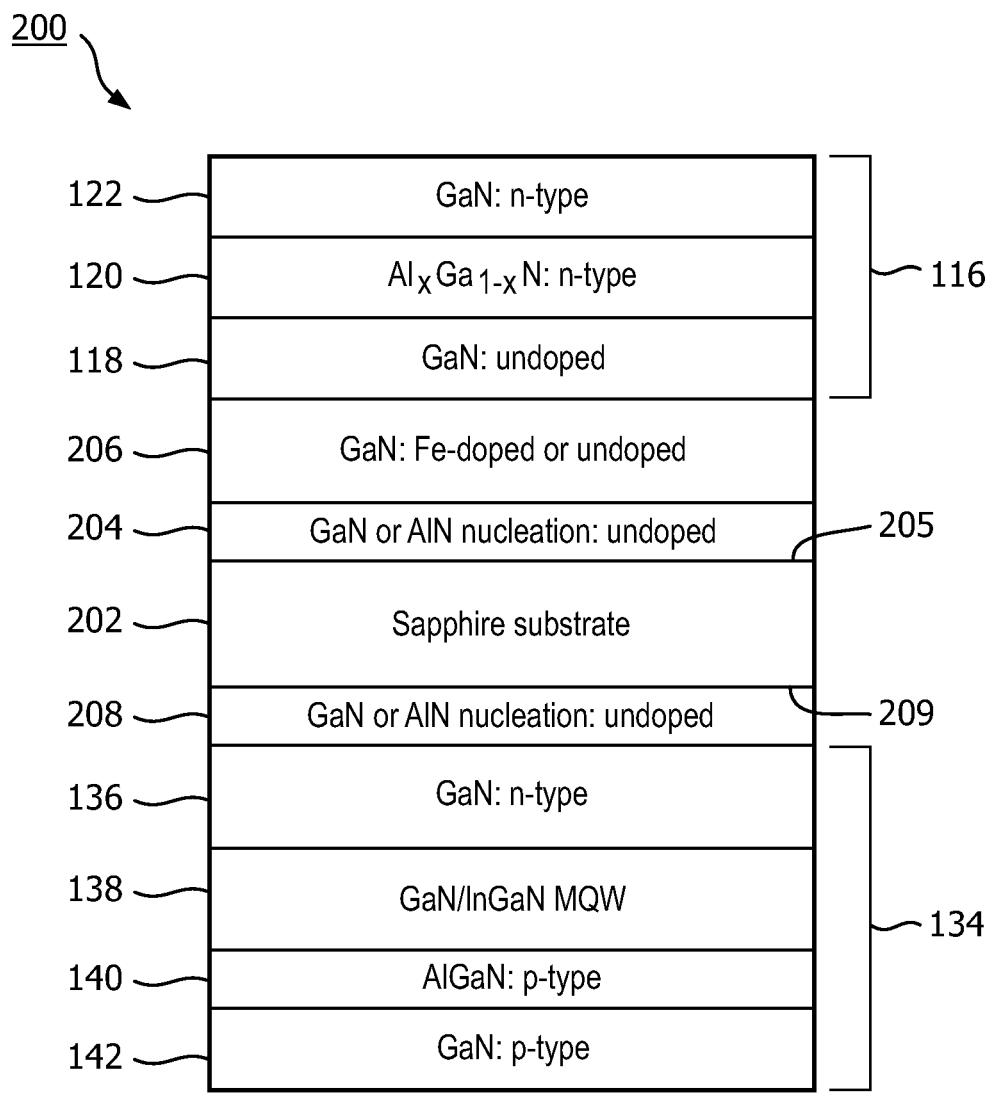
FIG. 2 is a cross-sectional view of an epitaxial structure for integrating GaN LEDs with AlGaN/GaN devices on a sapphire substrate.

FIG. 2 is a cross-sectional view of an epitaxial structure 200 for integrating GaN LEDs with AlGaN/GaN devices on a sapphire substrate 202 in one or more embodiments of the present disclosure. An undoped buffer layer 204 is first formed over a first side 205 of sapphire substrate 202 (e.g., a topside as shown) to provide a seed for growing other layers. Undoped buffer layer 204 maybe composed of GaN or AlN. An undoped GaN layer 206 is next formed on undoped buffer layer 204. Alternatively GaN layer 206 may be doped with n-type dopant such as Fe to increase its resistance. GaN layer 206 is non-conducting so it prevents lateral leakage current from any HFET device above the layer when the HFET is turned off. Isolation trenches may be etched down to GaN layer 206 to electrically insulate devices formed above the layer.

AlGaN/GaN heterojunction stack 116 (described earlier) is formed over GaN layer 206. Undoped GaN layer 118 of heterojunction stack 116 is directly over GaN layer 206. AlGaN/GaN heterojunction stack 116 may be further processed to form devices including HFETs and Schottky diodes. Additional circuit elements may be integrated with, or built in layers over, AlGaN/GaN heterojunction stack 116.

An undoped nucleation layer 208 is formed over a second side 209 of sapphire substrate 202 (e.g., a backside as shown) to seed other layers. Undoped nucleation layer 208 may be composed of GaN or AlN. GaN LED stack 134 (described earlier) is formed over undoped nucleation layer 208. N-type GaN layer 136 of stack 134 is directly over undoped nucleation layer 208. GaN LED stack 134 may be further processed to exposed areas of n-type GaN layer 136 and p-type GaN layer 142 for forming n- and p-contacts. Additional circuit elements may be integrated with, or built in layers over, GaN LED stack 134.

Figure 3:
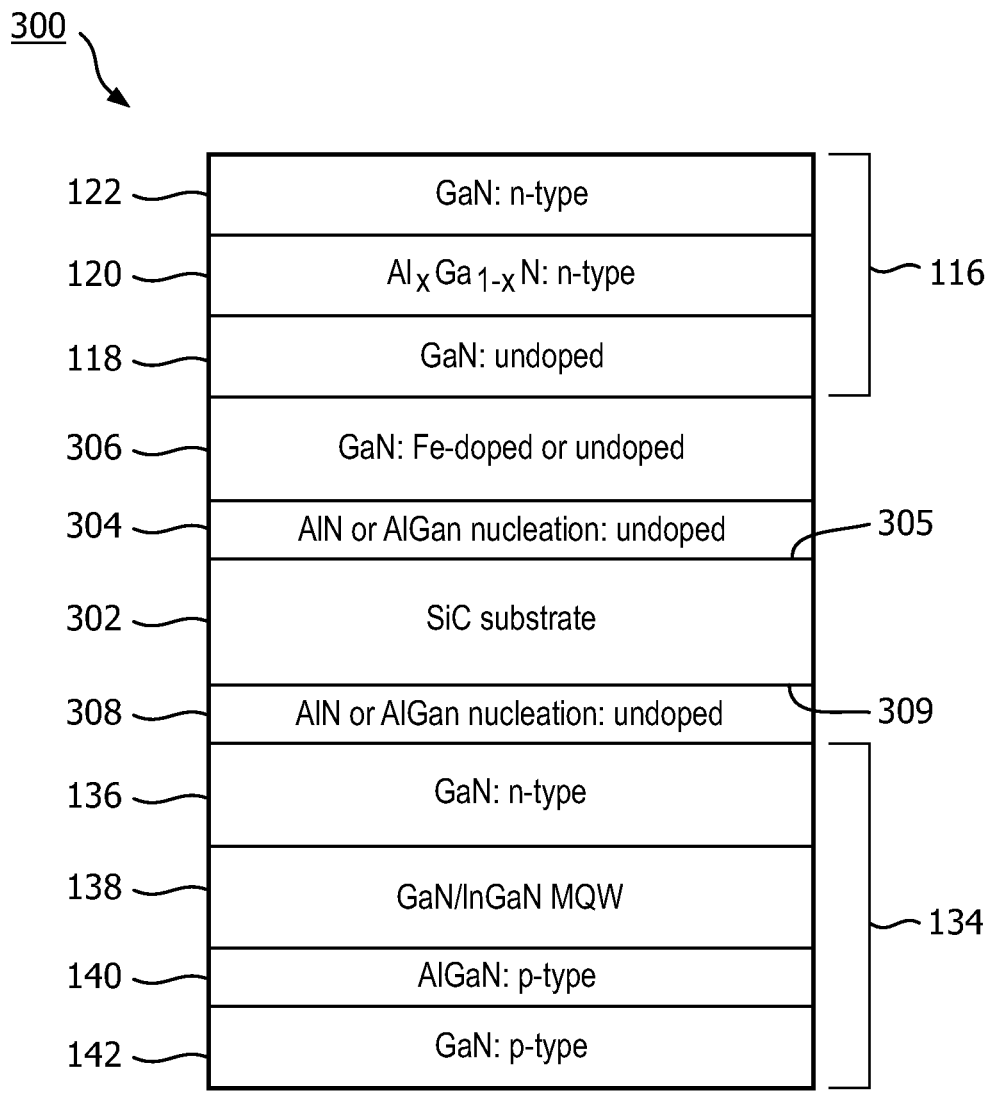
FIG. 3 is a cross-sectional view of an epitaxial structure for integrating GaN LEDs with AlGaN/GaN devices on a silicon carbon (SiC) substrate.

FIG. 3 is a cross-sectional view of an epitaxial structure 300 for integrating GaN LEDs with AlGaN/GaN devices on a silicon carbon (SiC) substrate 302 in one or more embodiments of the present disclosure. An undoped nucleation layer 304 is first formed over a first side 305 of SiC substrate 302 (e.g., a topside as shown) to seed other layers. Undoped nucleation layer 304 may be composed of AlN or $Al_xGa_{1-x}N$. An undoped GaN layer 306 is next formed on undoped nucleation layer 304. Alternatively GaN layer 306 may be doped with n-type dopant such Fe to increase its resistance. GaN layer 306 is non-conducting so it prevents lateral leakage current from any HFET device above the layer when the HFET is turned off. Isolation trenches may be etched down to GaN layer 306 to electrically insulate devices formed above the layer.

AlGaN/GaN heterojunction stack 116 (described earlier) is formed over GaN layer 306. Undoped GaN layer 118 of heterojunction stack 116 is directly over GaN layer 306. AlGaN/GaN heterojunction stack 116 may be further processed to form devices including HFETs and Schottky diodes. Additional circuit elements may be integrated with, or built in layers over, AlGaN/GaN heterojunction stack 116.

An undoped nucleation layer 308 is formed over a second side (e.g., a backside as shown) 309 of SiC substrate 302 to seed other layers. Undoped nucleation layer 308 may be composed of AlN or $Al_xGa_{1-x}N$. GaN LED stack 134 (described earlier) is formed over undoped nucleation layer 308. N-type GaN layer 136 of stack 134 is directly over undoped nucleation layer 308. GaN LED stack 134 may be further processed to expose areas of n-type GaN layer 136 and p-type GaN layer 142 for forming n- and p-contacts. Additional circuit elements may be integrated with, or built in layers over, GaN LED stack 134.

Figure 4:
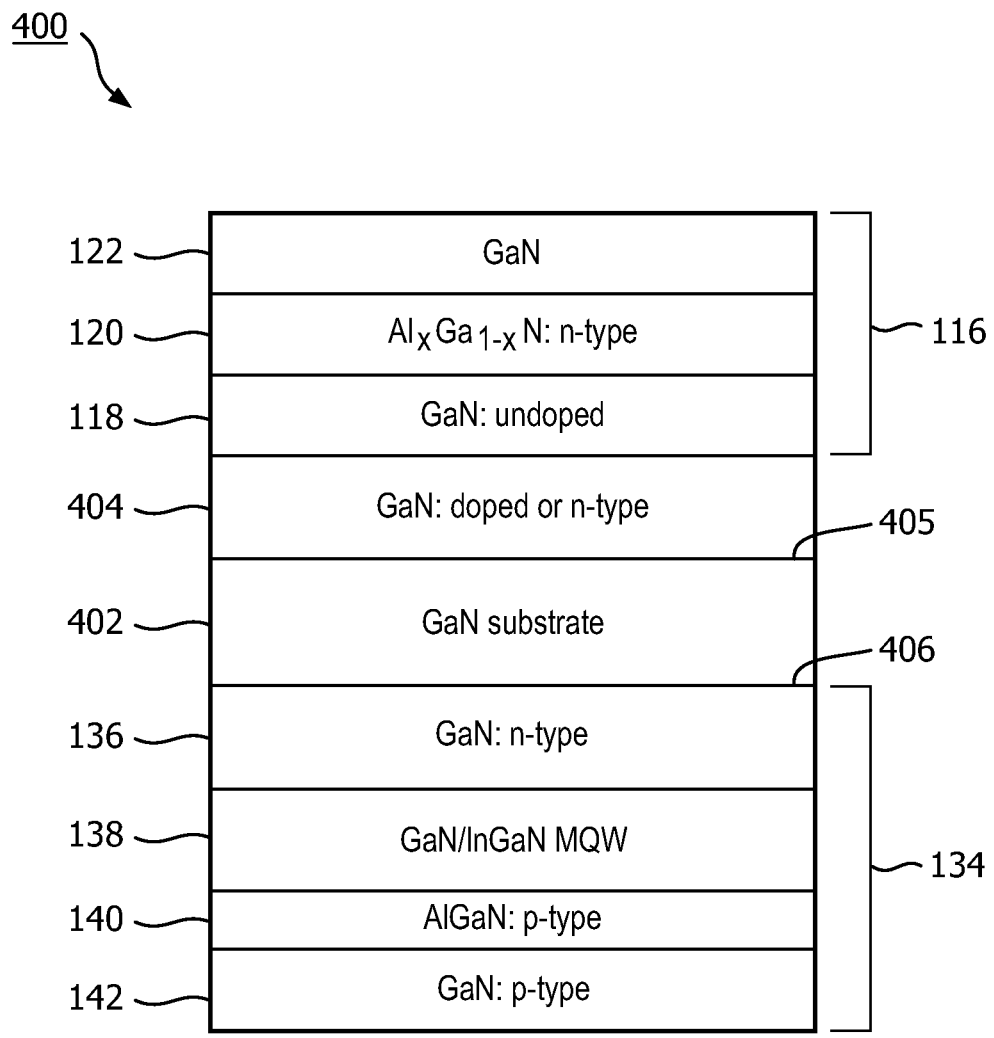
FIG. 4 is a cross-sectional view of an epitaxial structure for integrating GaN LEDs with AlGaN/GaN devices on a GaN substrate.

FIG. 4 is a cross-sectional view of an epitaxial structure 400 for integrating GaN LEDs with AlGaN/GaN devices on a GaN substrate 402 in one or more embodiments of the present disclosure. An undoped GaN layer 404 may be formed on a first side 405 of GaN substrate 402 (e.g., a topside as shown). Alternatively GaN layer 404 may be doped with n-type dopant such Fe to increase its resistance. GaN layer 404 is non-conducting so it prevents lateral leakage current from any HFET device above the layer when the HFET is turned off. Isolation trenches may be etched down to GaN layer 404 to electrically insulate devices formed above the layer.

AlGaN/GaN heterojunction stack 116 (described earlier) is formed over GaN layer 404. Undoped GaN layer 118 of heterojunction stack 116 is directly over GaN layer 404. AlGaN/GaN heterojunction stack 116 may be further processed to form devices including HFETs and Schottky diodes. Additional circuit elements may be integrated with, or built in layers over, AlGaN/GaN heterojunction stack 116.

GaN LED stack 134 (described earlier) is formed on a second side 406 of GaN substrate 402 (e.g., a backside as shown). N-type GaN layer 136 of stack 134 is directly over GaN substrate 402. GaN LED stack 134 may be further processed to exposed areas of n-type GaN layer 136 and p-type GaN layer 142 for forming n- and p-contacts. Additional circuit elements may be integrated with, or built in layers over, GaN LED stack 134.

Figure 5:
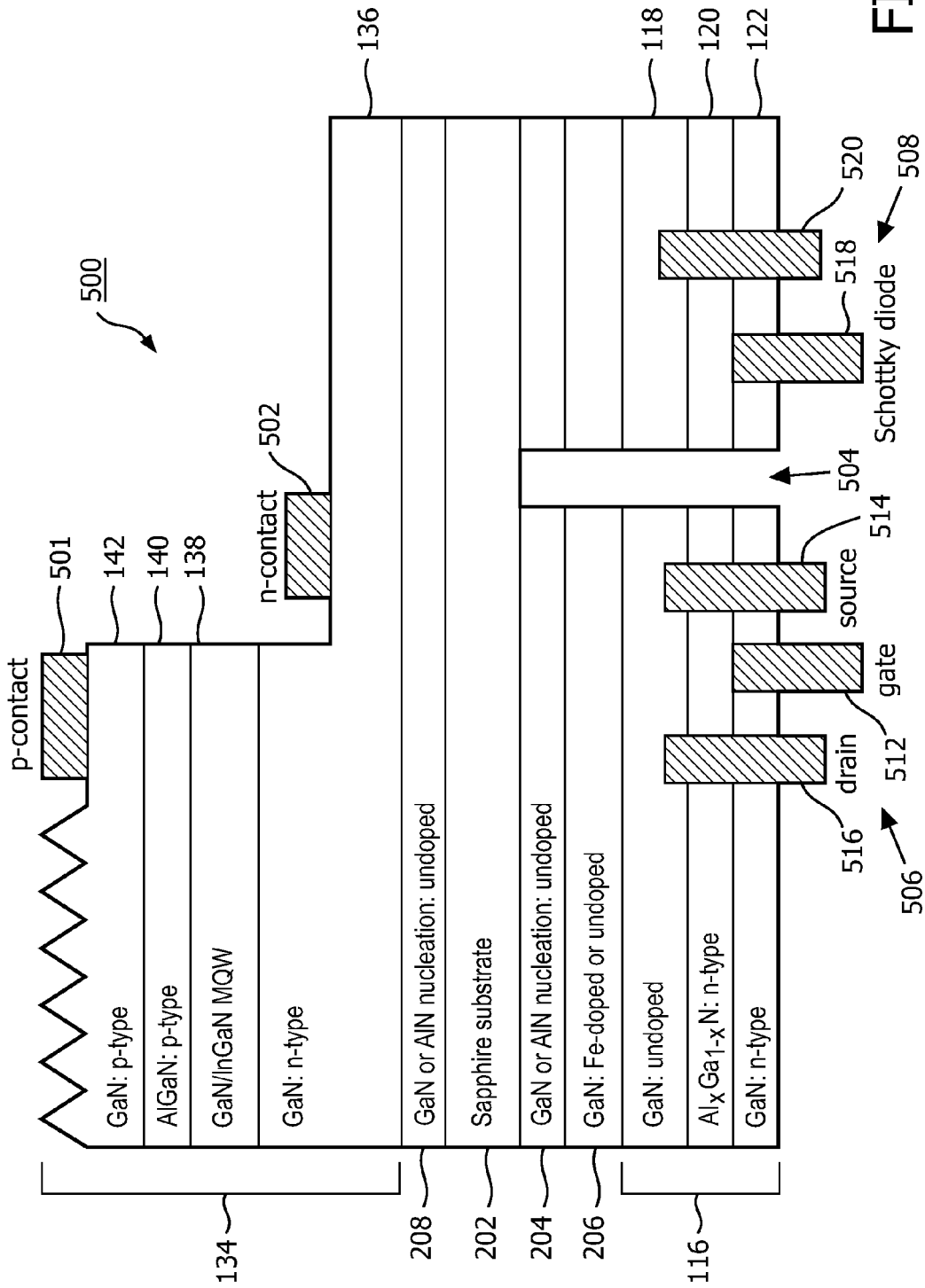
FIG. 5 shows a cross-sectional view of a structure resulting from the structure of FIG. 2 undergoing additional processing to form an AlGaN/GaN heterojunction field-effect transistor (HFET) and an AlGaN/GaN Schottky diode.

FIG. 5 shows a cross-sectional view of a structure 500 resulting from structure 200 (FIG. 2) undergoing additional processing to form an AlGaN/GaN HFETs 506 and an AlGaN/GaN Schottky diode 508 in one or more embodiments of the present disclosure.

P-type GaN layer 142 in GaN LED stack 134 may be roughened to improve light extraction. A p-contact 501 is formed on p-type GaN layer 142. One or more portions of structure 200 (FIG. 2) are removed down into n-type GaN layer 136 to form an n-contact 502 for an LED in GaN LED stack 134. In the alternative, portion of layers 116, 206, 204, 202, and 208 may be removed to form n-contact 502. In yet another alternative, layers 206, 204 202, 208, and all layers of GaN LED stack 134 except p-type GaN layer 142 may be removed to form p-contact 501. Locating all contacts on one side of the device enables a flip-chip configuration.

An isolation trench 504 is etched through AlGaN/GaN heterojunction stack 116, GaN layer 206, and GaN or AlN buffer layer 204 down to sapphire substrate 202 to electrically insulate an HFET 506 and a Schottky diode 508. HFET 506 and Schottky diode 508 are connected by interconnects (not shown) to form a driver circuit for the LED in GaN LED stack 134. Other circuit elements such as resistors, capacitors, and inductors may also be formed in AlGaN/GaN heterojunction stack 116.

HFET 506 includes a gate 512 and a source 514 and a drain 516 on the opposite sides of gate 512. Gate 512 contacts n-type $Al_xGa_{1-x}N$ layer 120, and source 514 and drain 516 contact undoped GaN layer 118. For gate 512, an opening is etched in n-type GaN passivation layer 122 and metal is deposited on n-type $Al_xGa_{1-x}N$ layer 120. For source 514 and drain 516, metal is deposited on n-type GaN passivation layer 122 and diffused down to undoped GaN layer 118 by annealing.

Schottky diode 508 includes an anode electrode 518 and a cathode electrode 520. Anode electrode 518 contacts n-type $Al_xGa_{1-x}N$ layer 120. To form anode electrode 518, an opening is etched in n-type GaN passivation layer 122 and metal is deposited on n-type $Al_xGa_{1-x}N$ layer 120. Cathode electrode 520 contacts undoped GaN layer 118. To form cathode electrode 520, metal is deposited on n-type GaN passivation layer 122 and diffused down to undoped GaN layer 118 by annealing.

Figure 6:
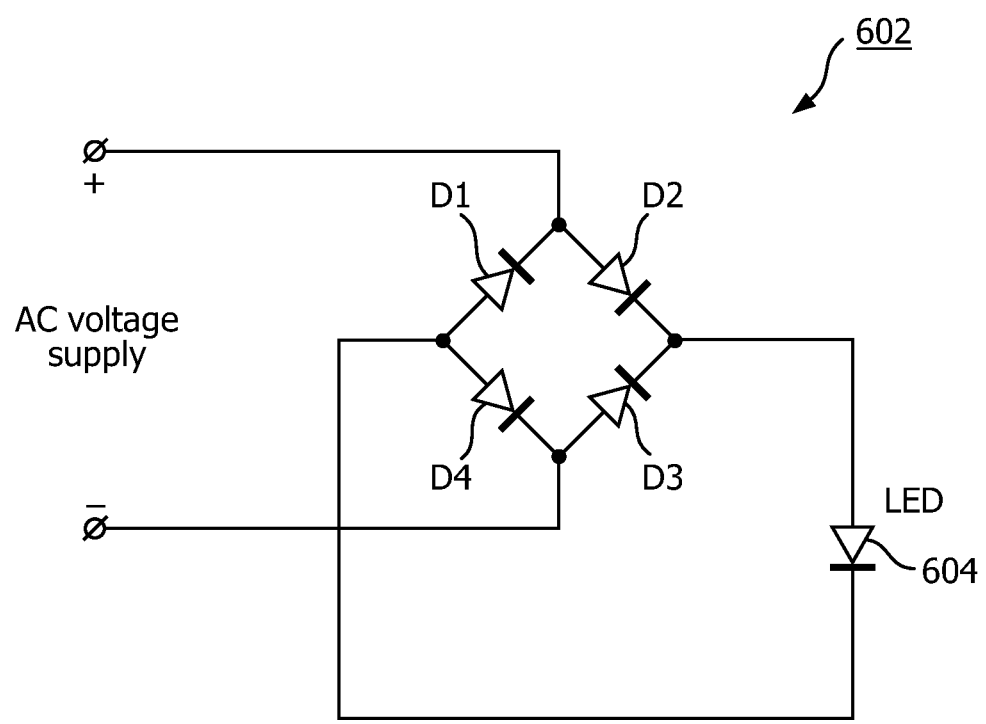
FIG. 6 is a circuit diagram of a bridge rectifier circuit connected in series with an LED.

FIG. 6 is a circuit diagram of a bridge rectifier circuit 602 connected to an LED 604. Bridge rectifier circuit 602 converts an AC voltage supply to DC voltage in order to power the LED in one or more embodiments of the present disclosure. Circuit 602 includes diodes D1, D2, D3, and D4 arranged in a typical diamond configuration where the cathode of diode D1 is connected to the anode of diode D2 and one side of the AC supply voltage, the cathode of diode D4 is connected to the anode of diode D3 and the other side of the AC supply voltage. The anodes of diodes D1 and D4 are the negative side of the rectified supply voltage for LED 604 and are connected to the cathode of LED 604. The cathodes of diodes D2 and D3 are the positive side of the rectified voltage and are connected to the anode of LED 604.

Figure 7:
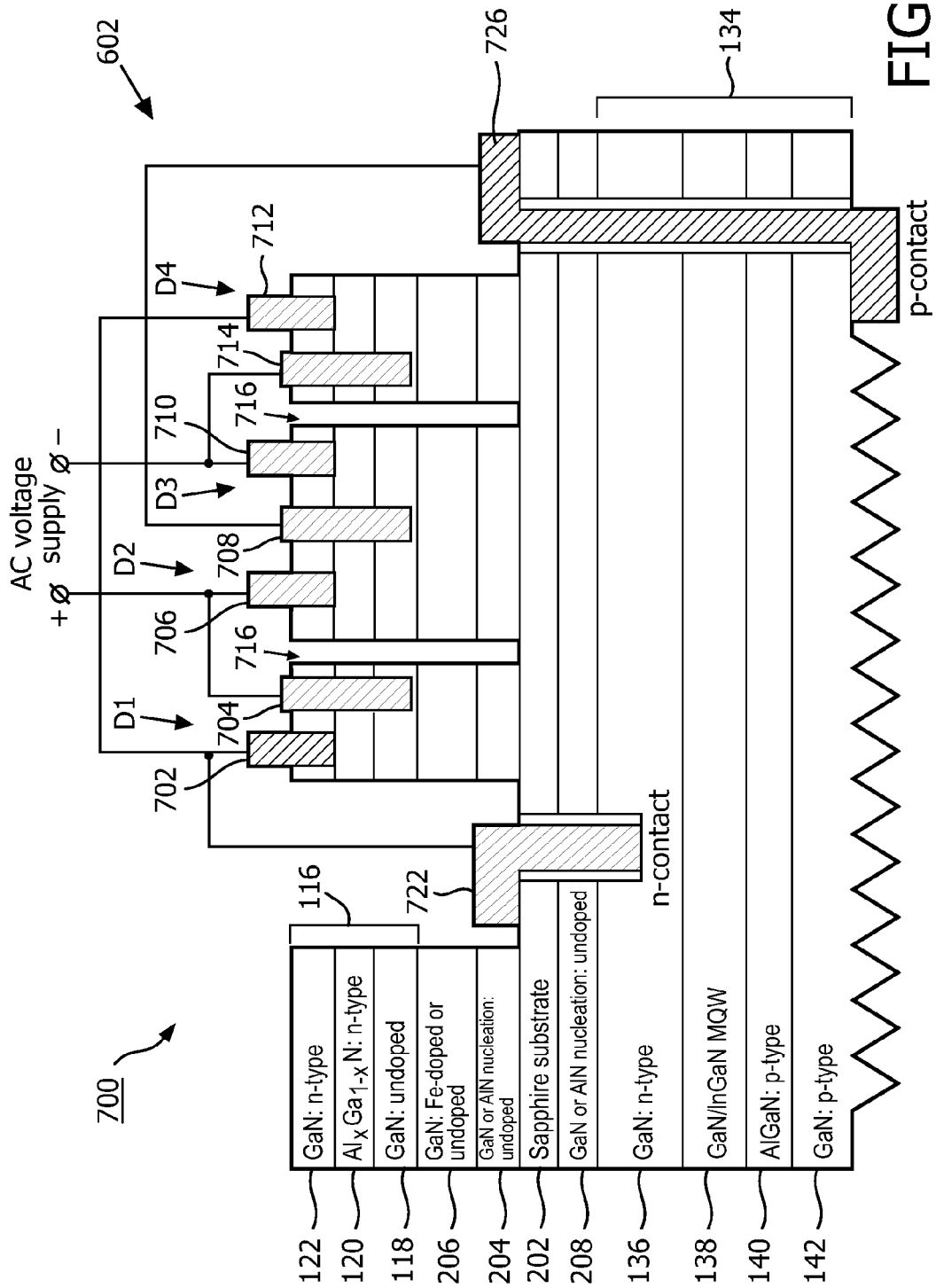
FIG. 7 shows a cross-sectional view of a structure resulting from the structure of FIG. 2 undergoing additional processing to form the bridge rectifier circuit of FIG. 6, all arranged in accordance with embodiments of the invention.

FIG. 7 shows a cross-sectional view of a structure 700 resulting from structure 200 (FIG. 2) undergoing additional processing to form bridge rectifier circuit 602 (FIG. 6) in one or more embodiments of the present disclosure. Each diode in circuit 602 is implemented as an AlGaN/GaN Schottky diode in heterojunction stack 116. Diode D1 includes an anode electrode 702 and a cathode electrode 704. Diode D2 has an anode electrode 706 and shares a cathode electrode 708 with diode D3 because they are connected in series through undoped GaN layer 118. Diode D3 has an anode electrode 710 and cathode electrode 708. Diode D4 has an anode electrode 712 and a cathode electrode 714. Each anode electrode contacts n-type $Al_xGa_{1-x}N$ layer 120, and each cathode electrode contacts undoped GaN layer 118. Diodes D1, D2, D3, and D4 are formed by the method described for forming diode 508 in structure 500 (FIG. 5).

Portions of AlGaN/GaN heterojunction stack 116, GaN layer 206, and GaN or AlN buffer layer 204 are removed to expose areas of sapphire substrate 202. In one exposed area, an n-contact 722 is formed by etching an opening through sapphire substrate 202 and GaN or AlN buffer layer 208 and partially into n-type GaN layer 136 in GaN LED stack 134, and depositing metal in the opening. In another exposed area, a p-contact 726 is formed by etching a hole through sapphire substrate 202, GaN or AlN buffer layer 208, and GaN LED stack 134, and depositing metal in the hole to contact p-type GaN layer 142 in GaN LED stack 134. Although not shown, the sidewalls of the holes for n-contact 722 and p-contact 726 are covered with an insulator such an oxide. In an alternative embodiment the openings for n-contact 722 and p-contact 726 are each wide enough to allow a pillar of metal to be deposited without contacting the "sides" of the opening. In another alternative a portion of p-type GaN layer 142 is left at the bottom of the opening and p-contact is 726 is deposited on the non-roughened surface of p-type GaN layer 142. In this last embodiment there is no p-contact blocking any of the light from the LED formed by GaN LED stack 134.

Diodes D1, diodes D2, D3, and diodes D4 are electrically insulated from each other by isolation trenches 716. Isolation trenches 716 are etched through AlGaN/GaN heterojunction stack 116, GaN layer 206, and GaN or AlN buffer layer 204 down to sapphire substrate 202 to electrically insulate diodes D1, the pair of diodes D2, D3, and D4 from each other. Interconnects connect diodes D1, D2, D3, and D4 as shown in FIG. 6. In particular, interconnects connect cathode electrode 708 (the cathodes of D2 and D3) to p-contact 726, the anode, of the LED in GaN LED stack 126, and anode electrodes 702 and 712 to n-contact 722, the cathode, of the LED in GaN LED stack 134. One side of the AC voltage is supplied to cathode electrode 704 of diode D1 and also to anode electrode 706 of diode D2. The other side of the AC voltage is supplied to anode electrode 710 of diode D3 and also to cathode electrode 714 of diode D4.

Embodiments of the present disclosure offer the following advantages over the conventional LED-based light fixtures. The embodiments of the present disclosure integrate LEDs with the LED driver circuit on the same substrate template. Devices will be integrated on wafer-level with metal interconnects instead of the conventional method of making discrete LEDs and the LED driver circuit separately and then combining them at the die level.

The embodiments of the present disclosure improve AC-DC conversion efficiency. GaN transistor switches have lower specific-on-resistance than Si-based devices, providing less ohmic losses due to switching.

The embodiments of the present disclosure have a smaller footprint. GaN transistors can handle higher operating voltage than Si-based devices so switching transistors can be made smaller. Necessary capacitors or inductors can also be made on wafer levels, thus reducing overall area.

The embodiments of the present disclosure are more economical. Die level interconnect, such as wire bonding and soldering, is no longer needed between the LED driver circuit and LEDs as they are now done at wafer level.

The embodiments of the present disclosure provide better temperature stability and prevent thermal runaway. LED current tends to have a positive temperature coefficient when driven at constant voltage because the LED's turn-on voltage becomes smaller when the LED warms up. In contrast, a field-effect transistor (FET) tends to have negative temperature coefficient due to drop in carrier mobility as the FET warms up. By placing LEDs and the LED driver circuit on the same substrate, the temperature effect is self-compensated, thereby preventing thermal runaway.

The embodiments of the present disclosure allow easier manufacturing for LED companies. An LED company may procure epitaxial wafers with AlGaN/GaN transistor structures grown on Si, sapphire, or SiC substrates from other companies and focus on improving LED structures on the other side of the substrates without worrying about optimizing the transistor structures. Furthermore, the thickness of the LED structures would not interfere with the transistor structures grown on the other side of the substrates. In other words, wafer processing of LEDs and transistors would not severely impact each other.

Various other adaptations and combinations of features of the embodiments disclosed are within the scope of the invention. Numerous embodiments are encompassed by the following claims.

The invention claimed is:

1. A method for fabricating an epitaxial structure, comprising:
providing a substrate and a heterojunction stack over a first side of the substrate, the heterojunction stack comprising an undoped gallium nitride (GaN) layer over the first side of the substrate and a doped aluminum gallium nitride (AlGaN) layer on the undoped GaN layer;
forming a GaN light emitting diode stack over a second side of the substrate, the GaN light emitting diode stack comprising an n-type GaN layer over the second side of the substrate, a GaN/indium gallium nitride (InGaN) multiple quantum well (MQW) structure over the n-type GaN layer, a p-type AlGaN layer over the GaN/InGaN MQW structure, and a p-type GaN layer over the p-type AlGaN layer, and
processing the heterojunction stack to form one or more devices coupled to the light emitting diode stack, the one or more devices are chosen from the group consisting of an AlGaN/GaN heterojunction field effect transistor (HFET) and an AlGaN/GaN Schottky diode.

2. The method of claim 1, wherein:
the substrate is a silicon substrate;
providing the substrate and the heterojunction stack over the first side of the substrate comprises:
forming a first strain engineered stack over the first side of the substrate, the first strain engineered stack accommodating strain between silicon and GaN; and
forming the heterojunction stack over the first strain engineered stack; and
the method further comprises forming a second strain engineered stack over the second side of the substrate, the GaN light emitting diode stack being formed over the second strain engineered stack, wherein:
the first strain engineered stack comprises:
a first GaN layer over the first side of the substrate; and
a first aluminum nitride (AlN) strain-releasing layer on the first GaN layer; and
the second strain engineered stack comprises:
a second GaN layer over the second side of the substrate; and
a second AlN strain-releasing layer on the second GaN layer.

3. The method of claim 2, further comprising:
forming a first undoped AlN buffer layer over the first side of the substrate;
forming a first undoped AlGaN layer over the first undoped AlN buffer layer, wherein the first strain engineered stack is formed over the first undoped AlGaN layer;
forming a second undoped AlN buffer layer over the second side of the substrate; and
forming a second undoped AlGaN layer over the second undoped AlN buffer layer, wherein the second strain engineered stack is formed over the second undoped AlGaN layer.

4. The method of claim 3, further comprising between the first strain engineered stack and the heterojunction stack, forming a nonconducting GaN layer.

5. The method of claim 1, wherein the substrate comprises a sapphire substrate, the method further comprising:
forming a first GaN or AlN nucleation layer over the first side of the substrate;
forming a non-conducting GaN layer over the GaN or AlN nucleation layer, wherein the heterojunction stack is formed over the non-conducting GaN layer; and
forming a second GaN or AlN nucleation layer over the second side of the substrate, wherein the GaN light emitting diode stack is formed over the second GaN or AlN buffer layer.

6. The method of claim 1, wherein the substrate comprises a silicon carbon (SiC) substrate, the method further comprising:
forming a first AlN or AlGaN nucleation layer over the first side of the substrate;
forming a non-conducting GaN layer over the first AlN or AlGaN buffer layer, the heterojunction stack being formed over the non-conducting GaN layer; and
forming a second AlN or AlGaN nucleation layer over the second side of the substrate, the GaN light emitting diode stack being formed over the second AlN or AlGaN nucleation layer.

7. The method of claim 1, wherein the substrate comprises a GaN substrate, the method further comprising forming a non-conducting GaN layer over the first side of the substrate, the heterojunction stack being formed over the non-conducting GaN layer.

8. The method of claim 1, wherein said processing the heterojunction stack comprises:
   forming a source for the AlGaN/GaN HFET that contacts the undoped GaN layer;
   forming a drain for the AlGaN/GaN HFET that contacts the undoped GaN layer;
   forming a gate for the AlGaN/GaN HFET that contacts the doped AlGaN layer;
   forming an anode for the AlGaN/GaN Schottky diode that contacts the doped AlGaN layer; and
   forming a cathode for the AlGaN/GaN Schottky diode that contacts the undoped GaN layer.

9. An epitaxial structure, comprising:
   a substrate;
   a heterojunction stack over a first side of the substrate, the heterojunction stack comprising an undoped GaN layer over the first side of the substrate and a doped AlGaN layer on the undoped GaN layer; and
   a GaN light emitting diode stack over a second side of the substrate, the GaN light emitting diode stack comprising an n-type GaN layer over the second side of the substrate, a GaN/InGaN MQW structure over the n-type GaN layer, a p-type AlGaN layer over the GaN/InGaN MQW structure, and a p-type GaN layer over the p-type AlGaN layer,
   wherein the heterojunction stack comprises one or more devices coupled to the light emitting diode stack, the one or more devices including one or more of an AlGaN/GaN heterojunction field effect transistor (HFET) and an AlGaN/GaN Schottky diode,
   wherein at least one of the devices is connected to the GaN light emitting diode stack.

10. The structure of claim 9, wherein the substrate is a silicon substrate, the structure further comprising:
    a first strain engineered stack over the first side of the substrate, the first strain engineered stack accommodating the strain between silicon and GaN, the heterojunction stack being over the first strain engineered stack; and
    a second strain engineered stack over the second side of the substrate, the GaN light emitting diode stack being over the second strain engineered stack wherein:
    the first strain engineered stack comprises:
       a first GaN layer over the first side of the substrate; and
       a first aluminum nitride (AlN) strain-releasing layer on the first GaN layer; and
    the second strain engineered stack comprises:
       a second GaN layer over the second side of the substrate; and
       a second AlN strain-releasing layer on the second GaN layer.

11. The structure of claim 9, further comprising:
    a first undoped AlN buffer layer over the first side of the substrate;
    a first undoped AlGaN layer over the first undoped AlN buffer layer, the first strain engineered stack being over the first undoped AlGaN layer;
    a second undoped AlN buffer layer over the second side of the substrate;
    a second undoped AlGaN layer over the second undoped AlN buffer layer, the GaN light emitting diode stack being over the second undoped AlGaN layer; and
    a non-conducting GaN layer over the first strain engineered stack, the heterojunction stack being over the non-conducting GaN layer.

12. The structure of claim 9, wherein the substrate comprises a sapphire substrate, the structure further comprising:
    a first GaN or AlN nucleation layer over the first side of the substrate;
    a non-conducting GaN layer over the first GaN or AlN nucleation layer, the heterojunction stack being over the non-conducting GaN layer; and
    a second GaN or AlN nucleation layer over the second side of the substrate, the GaN light emitting diode stack being over the second GaN or AlN nucleation layer.

13. The structure of claim 9, wherein the substrate comprises a SiC substrate, the structure further comprising:
    a first AlN or AlGaN nucleation layer over the first side of the substrate;
    a non-conducting GaN layer over the first AlN or AlGaN nucleation layer, the heterojunction stack being over the non-conducting GaN layer; and
    a second AlN or AlGaN nucleation layer over the second side of the substrate, the GaN light emitting diode stack being over the second AlN or AlGaN nucleation layer.

14. The structure of claim 9, wherein the substrate comprises a GaN substrate, the structure further comprising a non-conducting GaN layer over the first side of the substrate, the heterojunction stack being over the non-conducting GaN layer.

15. The structure of claim 1, wherein the heterojunction stack comprises:
    a source for the AlGaN/GaN HFET that contacts the undoped GaN layer;
    a drain for the AlGaN/GaN HFET that contacts the undoped GaN layer;
    a gate for the AlGaN/GaN HFET that contacts the doped AlGaN layer;
    an anode for the AlGaN/GaN Schottky diode that contacts the doped AlGaN layer; and
    a cathode for the AlGaN/GaN Schottky diode that contacts the undoped GaN layer.

* * * * *